United States Patent [19]
Lee et al.

[11] Patent Number: 5,995,368
[45] Date of Patent: Nov. 30, 1999

[54] AIR FLOW DISTRIBUTION DEVICE FOR SHELF-BASED CIRCUIT CARDS

[75] Inventors: Chi Keung Lee, Gloucester; William David Jeakins, Kanata, both of Canada

[73] Assignee: Nortel Networks Corporation, Montreal, Canada

[21] Appl. No.: 09/175,620

[22] Filed: Oct. 20, 1998

[51] Int. Cl.$^6$ .................................................. H05H 7/20
[52] U.S. Cl. .............................................................. 361/695
[58] Field of Search .......................... 62/259.2; 454/184; 361/688, 690, 694–697, 724, 736, 752, 796

[56] References Cited

U.S. PATENT DOCUMENTS

| | | | |
|---|---|---|---|
| 4,750,088 | 6/1988 | Frict | 361/694 |
| 4,860,163 | 8/1989 | Sarath . | |
| 5,027,254 | 6/1991 | Corfits et al. | 361/694 |
| 5,506,751 | 4/1996 | Chatel | 361/690 |

FOREIGN PATENT DOCUMENTS 2197536  5/1988  United Kingdom .

*Primary Examiner*—Gregory Thompson

[57] ABSTRACT

A device for improving air flow around shelf-based circuit cards housed within a card cage is disclosed where at least one fan is located above a rear portion of the card cage to draw air from beneath a forward portion of the card cage. The device is generally rectangular, having a forward portion, a rear portion and two side portions. A plurality of spaced parallel flanges extend from one side portion to the other side portion. Each flange, in cross-section, has an inverted L-shape, with a vertical section and a horizontal section, the horizontal section extending from the vertical section towards the forward portion of the device. Preferably, the height of the vertical section is a least 1.2 times the width of the horizontal section and the distance between adjacent flanges is at least the height of the vertical section. Also, preferably, the device is shaped from a single piece of sheet metal. The device is connected beneath the card cage with the forward portion of the device connected to the front cross member of the card cage and the rear portion connected to the rear cross member of the card cage.

8 Claims, 5 Drawing Sheets

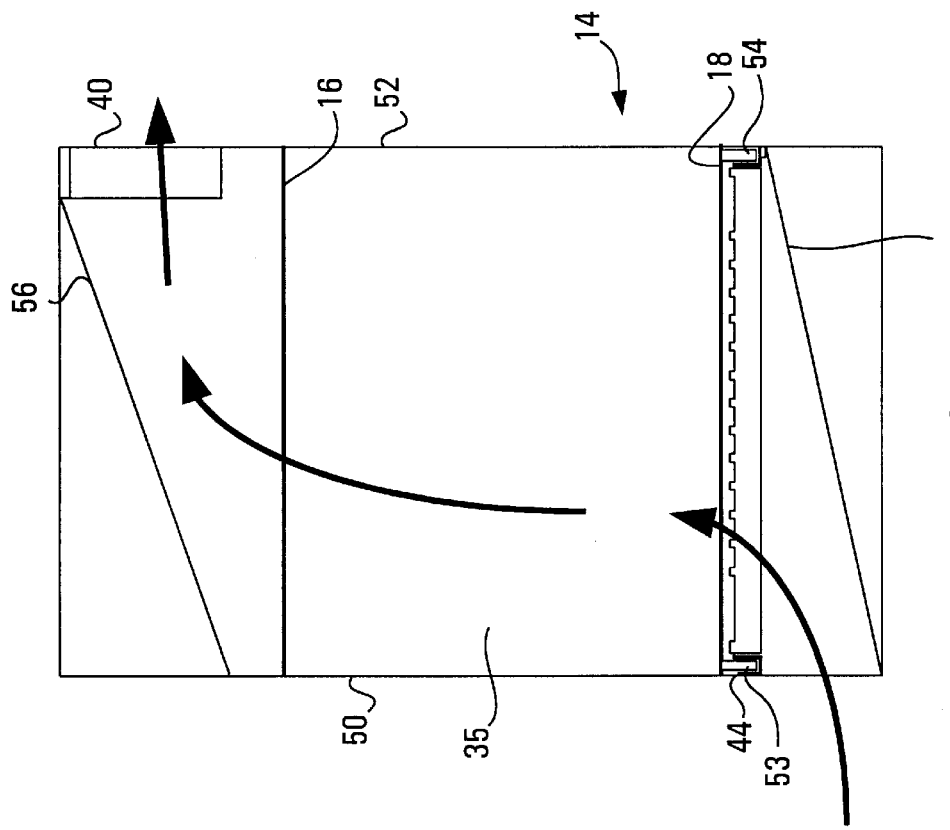
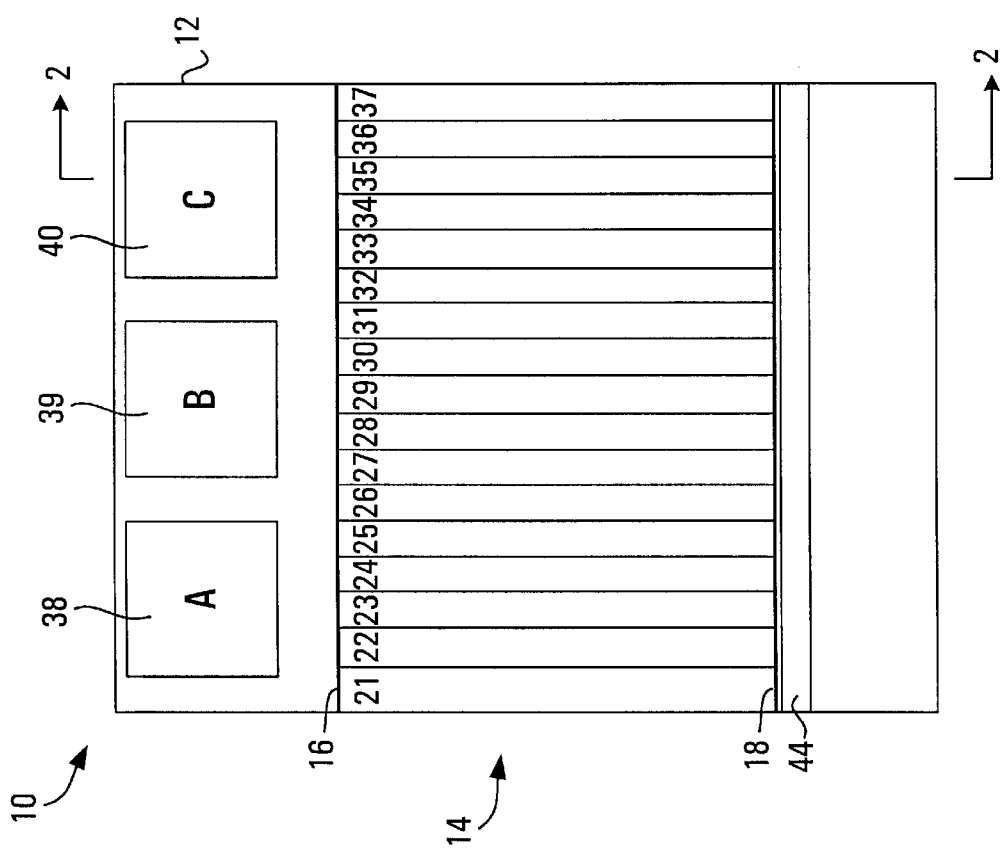

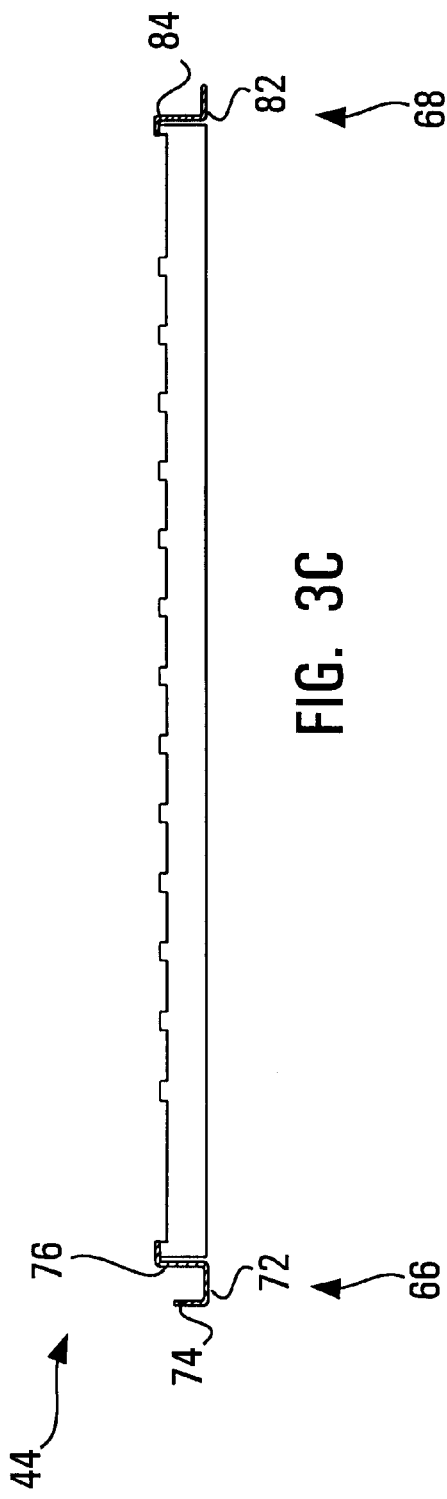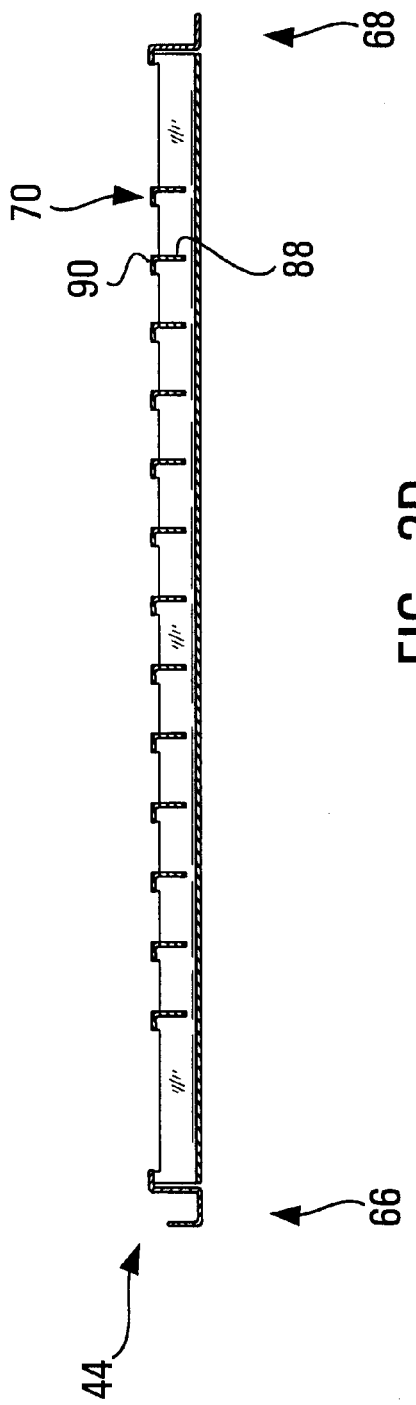

AIR FLOW DISTRIBUTION DEVICE FOR SHELF-BASED CIRCUIT CARDS

FIELD OF THE INVENTION

The invention relates to systems for cooling circuit cards (or circuit modules) which house electronic components and is particularly concerned with a device for improving the distribution of air flow through or around circuit modules.

BACKGROUND OF THE INVENTION

In electronics systems, electronic components such as printed circuit boards are often housed in circuit modules (or cages) having holes in their top and bottom portions to allow for air circulation around the components for cooling purposes. The modules are often arranged vertically, side-by-side, between shelves of a card cage, all of which being housed within a cabinet or chassis.

Often, electronics systems are cooled by fans which are placed in a permanent, fixed location inside the cabinet of the electronics system.

The prior art reveals complicated techniques to help improve the evenness of airflow through electronics systems. For example, UK patent application 2,197,536, in the name of STC plc and published on May 18, 1988, describes an equipment cabinet having a central chimney or spine in the centre, surrounded by electronic circuit units. The units are stacked vertically. By a complicated arrangement of air intake areas, baffles, and inlets into the chimney, the cabinet helps to distribute airflow through the units. However, this invention requires a specially built cabinet and chimney structure and requires the ability to stack electronic component units vertically, which, given space constraints, may not be possible or desirable in many electronics systems.

A simpler device for improving airflow through circuit modules is described in U.S. Pat. No. 4,860,163 which was issued to Sarath in 1989. The Sarath device describes a cabinet for holding circuit modules, with a fan, centrally located, drawing air from one end of the cabinet. There is a wall at one end of the modules closest to the fan preventing air from flowing directly from the modules to the fan. Instead, air must flow around the wall to reach the fan. To further improve air flow distribution, baffles are placed along a portion of the sides of the cabinet to force air to flow over at least a portion of the modules. For this device to help improve the evenness of air flow, it appears necessary that the fan be relatively centrally located. If, as in many electronics systems, the fan is not centrally located, air flow will not be significantly improved, if at all, in portions of the modules remote from the fan.

In electronic systems, modules are often housed vertically in a cabinet. The modules typically have a faceplate at their forward portion and connectors at their rear portion for connection to a backplane. In such systems, often at least one fan is located above and at or near the rear portion of the modules (at or near the backplane), which draws air from below the forward portion of the modules. Accordingly, without a device to help evenly distribute air flow, the air will tend to travel in a relatively straight line defining a diagonal between the lower forward portion of the modules to the upper rear portion of the module, thereby avoiding to a significant extent, areas of the modules outside the diagonal.

For air flow distribution outside the above-described diagonal, filters, placed below the modules, have helped to an extent. Because a filter creates an obstacle to air flow, a filter helps to distribute the air entering the modules over a greater proportion of the surface area of the bottom of each module. As a result, the use of a filter helps improve air flow distribution through the modules. However, filters add to the cost of such systems and require periodic maintenance (to either clean the filters or to replace them when they become "dirty").

In the absence of a filter, honeycomb structures have been used to help air flow distribution. Although such honeycomb structures improve airflow, they are relatively expensive to manufacture and they do not distribute air over the surface area of the modules as evenly as is desirable.

SUMMARY OF THE INVENTION

It is an object of the invention is to obviate or mitigate one or more of the above identified disadvantages.

According to a first broad aspect, the invention provides a generally rectangular device, formed from a single piece of sheet metal, for improving air flow distribution through a card cage of a cabinet, the card cage being of the type used to house slidably removable circuit cards, the card cage having a forward portion and a rear portion, the rear portion being adjacent to a backplane, the cabinet comprising one or more fans located above the rear portion of the card cage, the fans, when operating, draw air from an opening beneath the forward portion of the card cage, wherein the device comprises: connection means for permitting the device to be connected below the card cage; a forward portion, a rear portion and two side surfaces spaced between the front portion and the rear portion; a plurality of spaced parallel flanges, each flange extending from one of the two side surfaces to the other of the two side surfaces, and each flange, in cross-section parallel to each one of the two side surfaces, being of generally inverted L-shape having a generally vertical section and a generally horizontal section, the horizontal section extending from the vertical section towards the forward portion of the device; wherein, when installed, the device is connected by the connection means within the cabinet below the card cage and above the opening beneath the forward portion of the card cage, with the forward portion of the device located near the forward portion of the card cage, and the rear portion of the device located near the rear portion of the card cage.

According to another broad aspect, the invention provides a cabinet for circuit cards, having a forward portion and a rear portion, the cabinet comprising: a forward portion and a rear portion; a card cage for housing slidably removable circuit cards, the card cage having a forward portion located at or near the forward portion of the cabinet and a rear portion located at or near the rear portion of the cabinet; a backplane located near the rear portion of the cabinet; one or more fans located above the rear portion of the card cage, wherein, when operating, the fans draw air from an opening beneath the forward portion of the card cage; a lower baffle located beneath the card cage, the baffle slanted upwards from the forward portion of the cabinet to the rear portion of the cabinet; an upper baffle located above the card cage, the baffle slanted upwards from the forward portion of the cabinet to the rear portion of the cabinet; a generally rectangular device for improving air flow distribution through the card cage, the device comprising: connection means for engaging the device below the card cage; a forward portion, a rear portion and two side surfaces spaced between the front portion and the rear portion; a plurality of spaced parallel flanges, each flange extending from one of the two side surfaces to the other of the two side surfaces, and each flange, in cross-section parallel to each one of the two side surfaces, being of generally inverted L-shape having a generally vertical section and a generally horizontal section, the horizontal section extending from the vertical section towards the forward portion of the device, wherein, the device is connected by the connection means within the cabinet below the card cage and above the opening beneath the forward portion of the card cage, with the forward portion of the device located near the forward portion of the card cage, and the rear portion of the device located near the rear portion of the card cage.

Advantages of the present invention include the provision of a maintenance free, relatively simple and inexpensive structure for improving the evenness of air flow through circuit modules.

BRIEF DESCRIPTION OF THE DRAWINGS

Preferred embodiments of the invention will now be described with reference to the attached drawings in which FIG. 1 is a schematic sectional view of a cabinet having a card cage housing circuit modules with fans above the card cage;

FIG. 2 is a sectional view of the cabinet taken along line 2—2 of FIG. 1, with arrows showing the approximate path of air flow;

FIG. 3b is a top view of the device of FIG. 3a;

FIG. 3c is a side view of the device of FIG. 3a;

FIG. 3d is a sectional view of the device taken along line 3d—3d of FIG. 3b;

DETAILED DESCRIPTION OF THE PREFERRED EMBODIMENTS

Figure 3A:
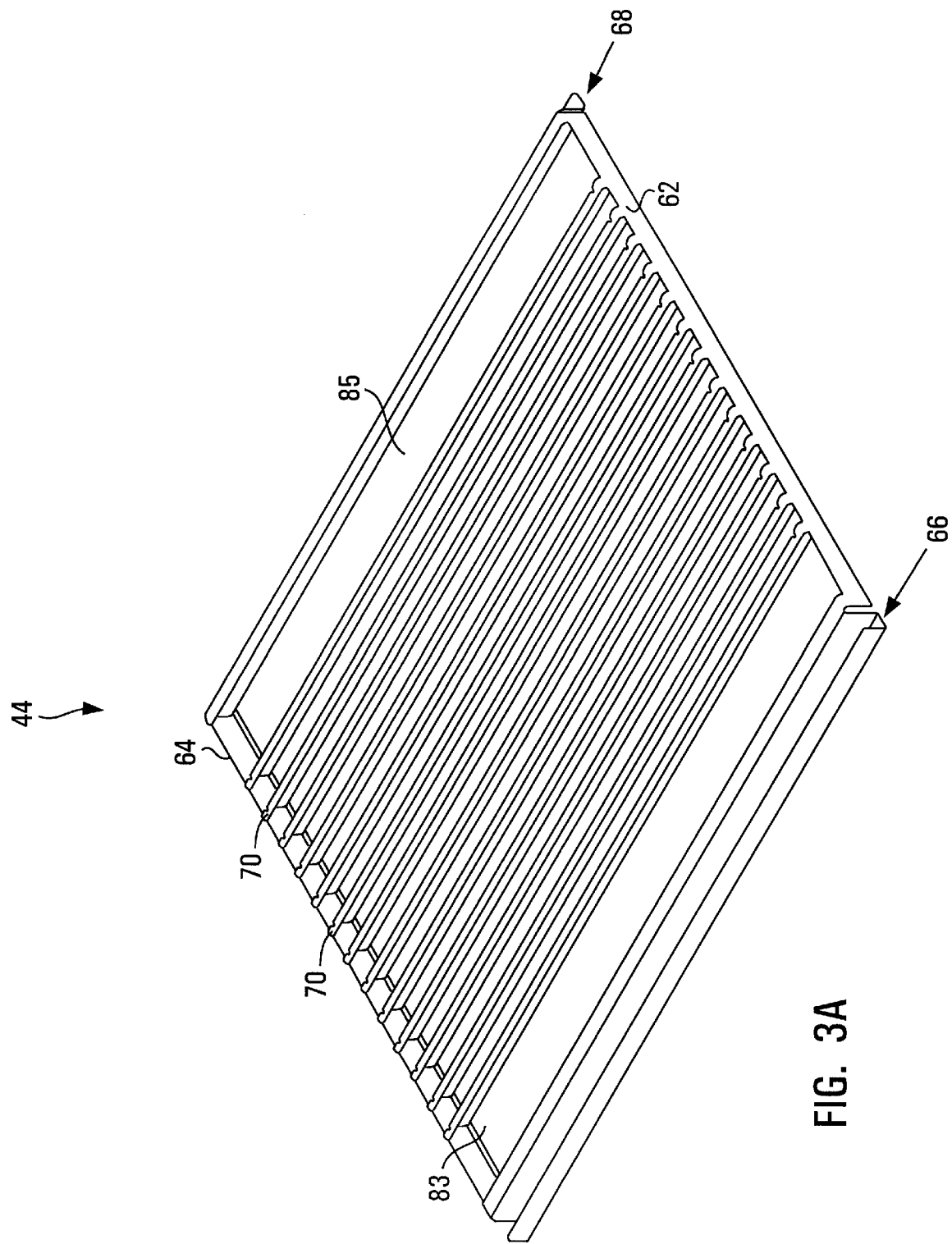
FIG. 3a is a front perspective view of a device for improving air flow distribution, in accordance with an embodiment of the present invention.

A schematic sectional view of an electronics system, generally designated 10, is shown FIG. 1. The electronics system 10 has a chassis or cabinet 12 which houses, amongst other things, a card cage 14 having an upper shelf 16 and a lower shelf 18, circuit cards (or circuit modules) 21–37, fans 38, 39, 40 and an air flow distribution unit (hereinafter sometimes referred to as "the AFD") 44.

The circuit cards 21–37 are oriented vertically, one beside the other. (17 cards are illustrated in FIG. 1 for example purposes only. Any number of cards could be used.) Each card contains a printed circuit board (not shown). If modules are used, each module, typically made of steel, will typically contain one printed circuit board (not shown) on which is mounted electronic components. Each module has openings (not shown) on its upper and lower surfaces (not shown) to permit air to flow through the module for cooling the components.

As shown in the cross-sectional view of FIG. 2 of the cabinet 12 taken along line 2—2 of FIG. 1, each card (as illustrated by the representative card) 35 is slidable into or out of the card cage 14 along two card guides 48 (not shown). Each card 35 typically has, on a forward surface 50, a faceplate (not shown) and on a rear surface 52, connectors (not shown) for connection with pins (not shown) protruding from a backplane (not shown).

Extending across a forward portion of the lower shelf 18 of the card cage 14 is a front cross member 53. Extending across a rear portion of the lower shelf 18 of the card cage 14 is a rear cross member 54. (Instead of having both front and rear cross-members, the lower shelf 18 could incorporate a single lower shelf cross-member (not shown) constituting the perimeter of the lower shelf 18). As will be discussed below, the AFD 44 is preferably fastened to the front cross member and to the rear cross member.

As shown in FIG. 2, the cabinet 12 also has a diagonal baffle 56 located above the card cage 14 and another diagonal baffle 58 located below the card cage 14. The baffles 56, 58 are for protection. Because a number of card cages 14 could be stacked one on top of the other, the baffles 56,58 help segregate air flow through one card cage from air flow through another card cage. The baffles also provide fire protection between adjacent card cages.

The AFD 44 will now be described in detail with reference FIGS. 3a, 3b, 3c and 3d which show the AFD 44 in perspective view, top view, side view and cross-sectional view, respectively. As shown in the top view of FIG. 3b, the AFD 44 is generally rectangular having side surfaces 62, 64, a forward portion 66 and a rear portion 68. As suggested in FIG. 3b, a lower portion 69 of each one of the side surfaces 62, 64 is preferably bent inwardly (ie: towards the other side surface) for increased strength. A plurality of spaced flanges 70 extends between side surfaces 62, 64, each flange being parallel with forward portion 66 and rear portion 68.

As shown in FIG. 3d, Each flange 70 has an inverted L-shape in cross-section, with a vertical portion 88 and a horizontal portion 90, the horizontal portion 90 projecting towards the forward portion 66 from the vertical portion 88. In the preferred embodiment, the height of the vertical portion 88 should be at least 1.2 times greater than the width of the horizontal portion 90. Although a specific distance between adjacent flanges 70 is not critical, an example of satisfactory spacing is approximately three times the width of the horizontal portion 90.

Figure 3B:
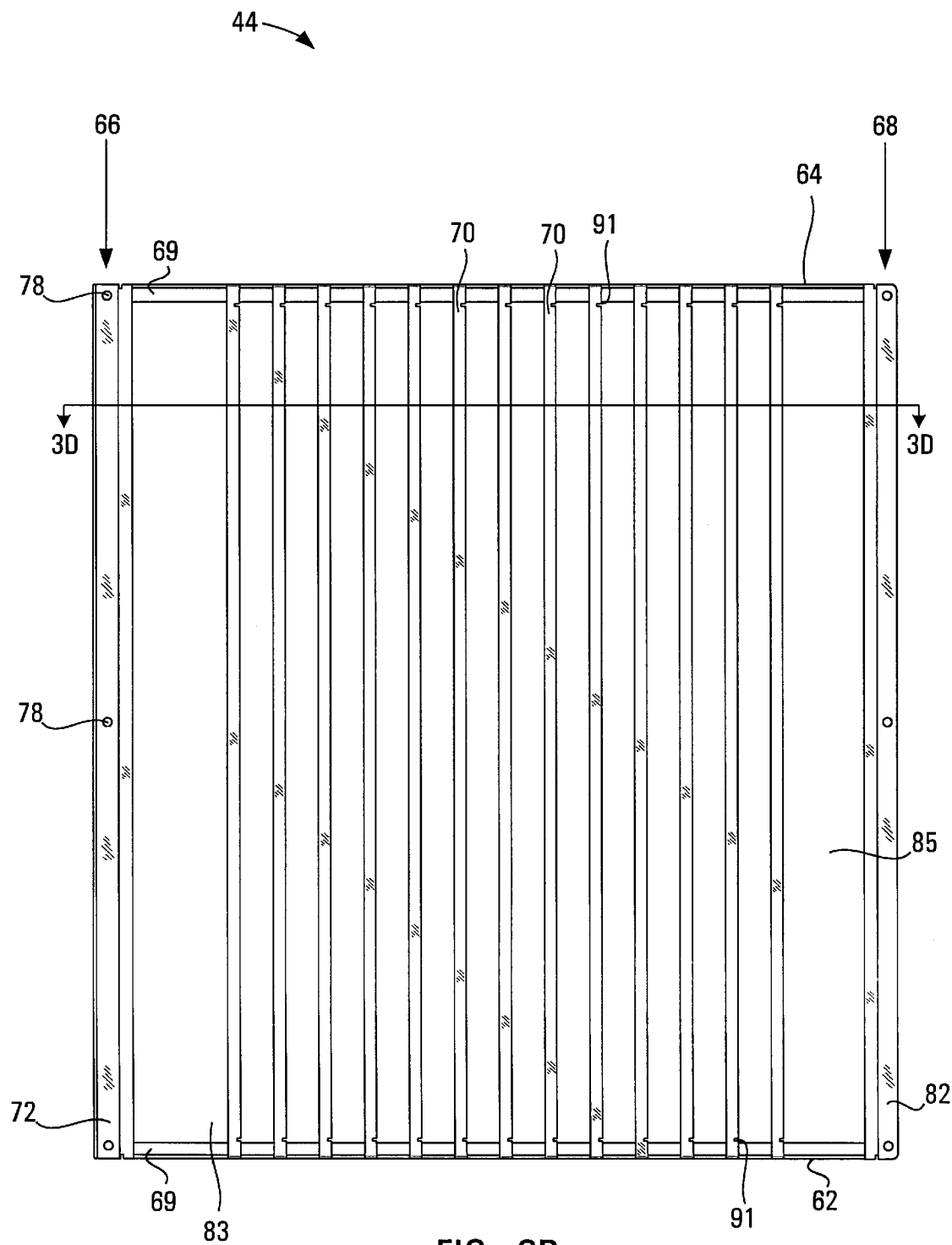

Although not necessary, as shown in the preferred embodiment of FIGS. 3a and 3c, the flanges 70 are somewhat raised from the side surfaces 62, 64. As well, as shown in FIG. 3b, each flange 70 preferably has a notch 91 located near each side 62, 64. The notches 91 provide "bend relief" which helps improve the the ease of manufacturing of the flanges 70.

As shown in the side and sectional views of FIGS. 3c and 3d, the front portion 66 is generally U-shaped, having a horizontal surface 72 and spaced vertical surfaces 74, 76. The front portion 66 is adapted to fit around bottom and side surfaces of the front cross member 53 of the cabinet 12. As shown in FIG. 3b, the horizontal portion 72 has three holes 78 formed therein, to allow the AFD 44 to be fastened to the front cross member 53 by screws (not shown).

The rear portion 68 of the AFD 44 is generally L-shaped in side view, having a horizontal surface 82 and a vertical surface 84. The rear portion 68 is adapted such that the horizontal surface 82 is able to rest adjacent a bottom surface of the rear cross member 54 of the card cage 14 and the vertical surface 84 is able to rest adjacent a side surface of the rear cross member 54. As shown in FIG. 3b, the horizontal surface 82 has three holes 78 formed therein to allow the AFD 44 to be fastened to the rear cross member 54 by screws (not shown) or other fastening devices such as by nails or alternatively by welding, glue, etc.

The shapes of the front portion 66 and the rear portion 68 can differ significantly from the those described above, so long as the AFD 44 is adapted to be fastened within the cabinet 12 with the horizontal portion 90 of the flanges 70 located relatively close to, and possibly touching, lower shelf 18 of the card cage 14. If the horizontal portion 90 of the flanges 70 is in contact with the lower shelf 18, this contact will improve the stiffness of the shelf 18. In the preferred embodiment, where a lower surface of the AFD 44 is positioned at approximately the same height as a lower surface of the front and rear cross members 53,54, the AFD 44 does not require any additional space within the cabinet 12 nor does use of the AFD 44 necessitate any special design modifications to the cabinet 12, because the AFD 44 fits within the already existing gap between the front cross member 53 and the rear cross member 54.

Referring to FIGS. 3a and 3b, it will be noted that there is a gap 83 between the forward portion 66 and the closest flange 70, which gap 83 is greater than the spacing between adjacent flanges 70. Similarly, there is a gap 85 between the rear portion 68 and the closest flange 70. Additional flanges 70 could be added to the AFD 44 to reduce the gap 83 without any decrease in the effectiveness of the AFD 44. In other words, depending upon the design of the cabinet 12 and the design and relative placement of the various elements within the cabinet 12, whether or not gap 83 is incorporated within the AFD 44 may be irrelevant to the effectiveness of the AFD 44. However, due to the proximity of the rear portion of baffle 58 to the rear portion 68 of AFD 44, the AFD 44 preferably incorporates gap 85 to help avoid choking air flow through an adjacent portion of the card cage 14.

The AFD 44 can be manufactured from a large number of materials including sheet metal or plastic. In the preferred embodiment, the AFD 44 is manufactured from sheet metal which typically has greater rigidity than plastic. It is also typically less expensive to design tooling for creating sheet metal of a particular design than for plastic. Further, the lead time to develop tooling for plastic is usually greater than with respect to sheet metal.

It should be noted that one of the indirect advantages of the configuration of the AFD 44 as described above and as illustrated in the drawings is that the AFD 44 can be stamped from a single piece of sheet metal, thereby avoiding the expense and inherent weakness created by welding or other methods of joining pieces of metal. For example, in very general terms, the AFD 44 may be manufactured by manipulating a piece of sheet metal to form the sections of the AFD 44 in the following order: gaps 83,85 are stamped out; the rear portion 68 is formed by bending horizontal surface 82 and vertical surface 84; the front portion 66 is formed by bending vertical surface 76, horizontal surface 72 and vertical surface 74; side surface 62 is formed; side surface 64 is formed; each flange 70 is formed by bending vertical portion 88. In order for the AFD 44 to be stamped from a single piece of sheet metal, the distance between adjacent flanges 70 must be no less than the height of the vertical portion 88 of each flange.

In use, the AFD 44 is fastened to the cross members 53,54 of the lower shelf 18 of the card cage 14. When the fans 38, 39, 40 are turned on, air is drawn from below the front cross member 53 of the lower shelf 18 of the card cage 14, towards the fans 38, 39, 40. Because of the obstruction created by the flanges 70 of the AFD 44, the air drawn by the fans 38, 39, 40 is unable to travel the direct diagonal path from below the front cross member 53 to the fans 38, 39, 40. The obstruction created by the flanges 70 thus helps to distribute air being drawn from below the front cross member 53 across all of the flanges 70. Because of the inverted L-shape of the flanges 70, the obstructed air, upon contacting one of the flanges 70 (or by following the air turbulence created by the flanges 70) is directed both upwardly and somewhat forwardly (ie: away from the fans 38, 39, 40).

Figure 4B:
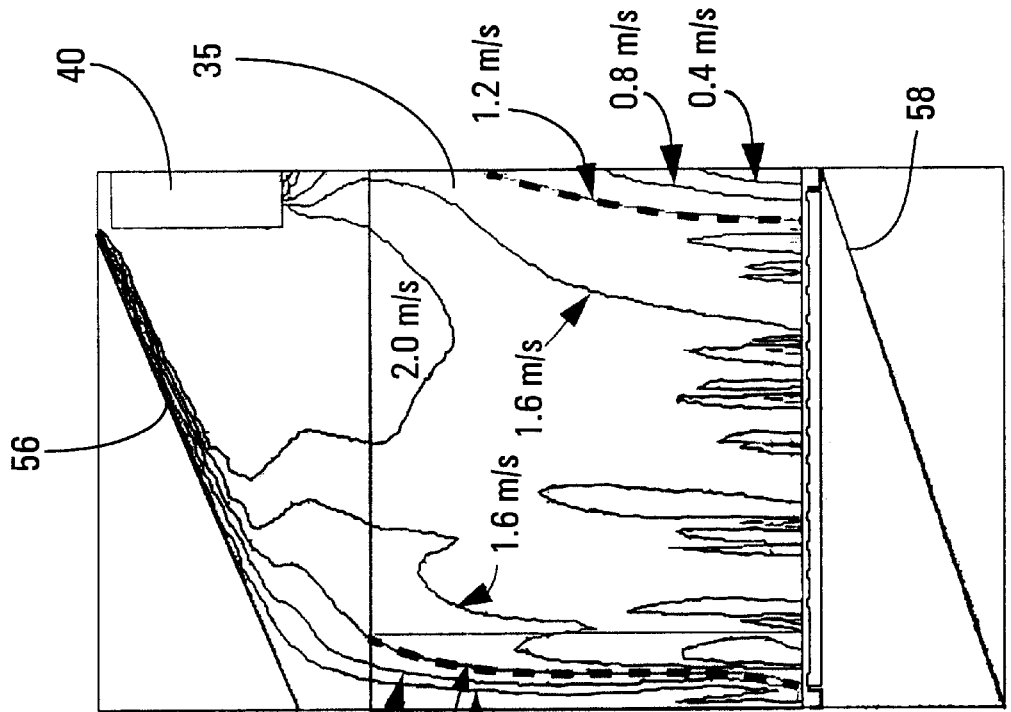
FIG. 4b is the schematic view of FIG. 2, showing the results of air flow models of air flow over different portions of a circuit module when the device of FIG. 3a is connected below the card cage.
Figure 4A:
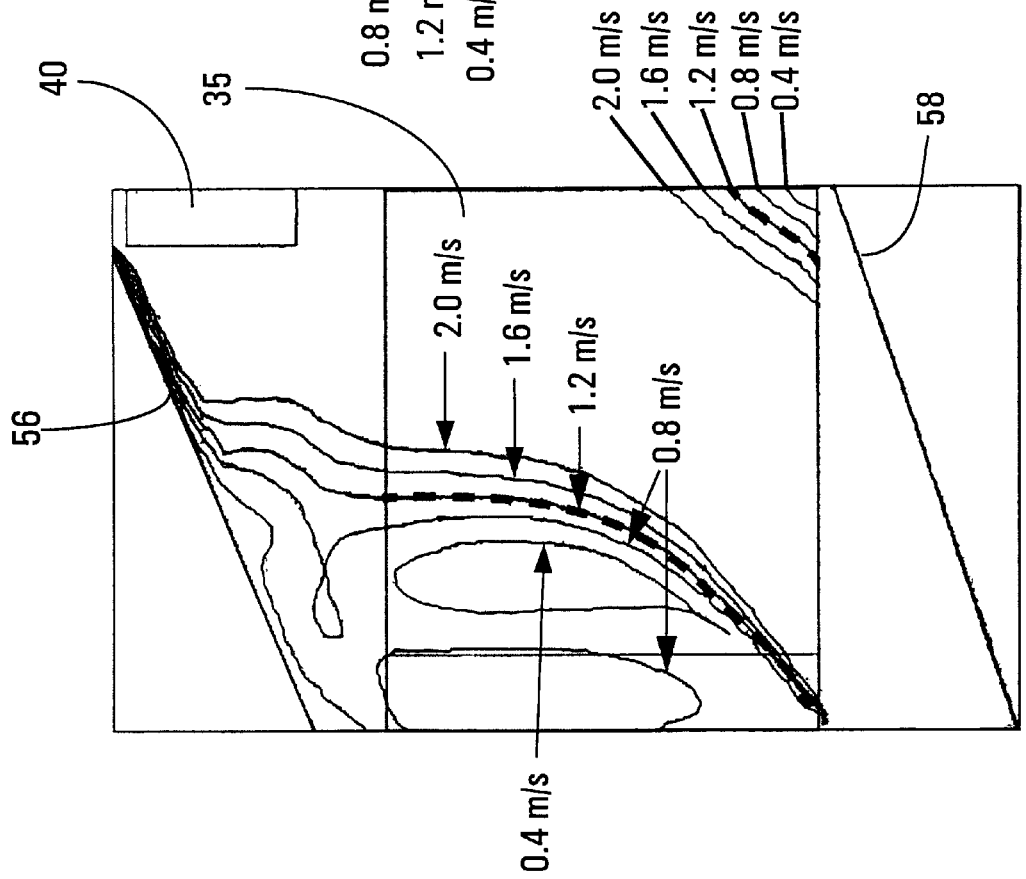
FIG. 4a is the schematic view of FIG. 2, showing the results of air flow models over different portions of a circuit module without the use of a device for improving air flow distribution.

The effectiveness of the AFD 44 is illustrated in FIGS. 4a and 4b which are drawings similar to the schematic sectional view of FIG. 2, showing the results of air flow models across a representative card 35 with an AFD 44 in place (FIG. 4b) and without an AFD 44 (FIG. 4a). Actual tests have confirmed the general trends and characteristics shown in FIGS. 4a and 4b. In the models shown in FIGS. 4a and 4b, the conditions were identical, including the rate at which the fan 40 was drawing air. In these models, air flow of 1.2 m/s or greater was considered desirable, and air flow of less than 1.2 m/s was considered less desirable (for appropriate cooling of a portion of the card 35 in contact with the air flow). In each case, the area between the heavy dotted lines represents air flow of 1.2 m/s or greater; and areas outside the heavy dotted lines represent air flow of less than 1.2 m/s.

As FIG. 4a illustrates, without the use of an AFD 44, a relatively large percentage of the card 35 receives insufficient air flow, whereas, when the AFD 44 is used, as shown in FIG. 4b, a significantly smaller area of the card receives insufficient air flow. As the results shown in FIG. 4b indicate, it is preferable, when designing a circuit board (not shown) to be housed within a card 35, that components requiring the most cooling not be placed on the circuit board where they will be near the forward surface 50 of the card 35 or near the lower ⅔ of the rear surface 52 of the card 35.

Numerous modifications and variations of the present invention are possible in light of the above teachings. It is therefore to be understood that within the scope of the appended claims, the invention may be practised otherwise than as specifically described herein.

We claim:

1. A generally rectangular device, formed from a single piece of sheet metal, for improving air flow distribution through a card cage of a cabinet, the card cage being of the type used to house slidably removable circuit cards, the card cage having a forward portion and a rear portion, the rear portion being adjacent to a backplane, the cabinet comprising one or more fans located above the rear portion of the card cage, the fans, when operating, draw air from an opening beneath the forward portion of the card cage, wherein the device comprises:

connection means for permitting the device to be connected below the card cage;

a forward portion, a rear portion and two side surfaces spaced between the front portion and the rear portion;

a plurality of spaced parallel flanges, each flange extending from one of the two side surfaces to the other of the two side surfaces, and each flange, in cross-section parallel to each one of the two side surfaces, being of generally inverted L-shape having a generally vertical section and a generally horizontal section, the horizontal section extending from the vertical section towards the forward portion of the device;

wherein, when installed, the device is connected by the connection means within the cabinet below the card cage and above the opening beneath the forward portion of the card cage, with the forward portion of the device located near the forward portion of the card cage, and the rear portion of the device located near the rear portion of the card cage.

2. The device of claim 1 wherein, for each flange, the height of the vertical section is at least 1.2 times greater than the width of the horizontal section.

3. The device of claim 1 wherein each flange is spaced from an adjacent flange by a distance of at least the height of the vertical section of each flange.

4. The device of claim 1 wherein the card cage has a front cross member extending across a lower portion of the card cage near the forward portion of the card cage and the card cage has a rear cross member extending across a lower portion of the card cage near the rear portion of the card cage wherein the connection means of the device comprises the forward portion of the device which is adapted to rest adjacent to one or more surfaces of the front cross member for connection therewith and the rear portion of the device which is adapted to rest adjacent to one or more surfaces of the rear cross member for connection therewith.

5. The device of claim 4 wherein the forward portion is generally U-shaped in cross-section parallel to each one of the two side surfaces and the rear portion is generally L-shaped in cross-section parallel to each one of the two side surfaces.

6. The device of claim 1 wherein each one of the two side surfaces is generally vertical and comprises a top portion and a bottom portion, the bottom portion being bent towards the other one of the two side surfaces.

7. The device of claim 6 wherein each flange extends above the top portion of each one of the two side surfaces.

8. A cabinet for circuit cards, having a forward portion and a rear portion, the cabinet comprising:

a forward portion and a rear portion;

a card cage for housing slidably removable circuit cards, the card cage having a forward portion located at or near the forward portion of the cabinet and a rear portion located at or near the rear portion of the cabinet;

a backplane located near the rear portion of the cabinet;

one or more fans located above the rear portion of the card cage, wherein, when operating, the fans draw air from an opening beneath the forward portion of the card cage;

a lower baffle located beneath the card cage, the baffle slanted upwards from the forward portion of the cabinet to the rear portion of the cabinet;

an upper baffle located above the card cage, the baffle slanted upwards from the forward portion of the cabinet to the rear portion of the cabinet;

a generally rectangular device for improving air flow distribution through the card cage, the device comprising:

connection means for engaging the device below the card cage;

a forward portion, a rear portion and two side surfaces spaced between the front portion and the rear portion;

a plurality of spaced parallel flanges, each flange extending from one of the two side surfaces to the other of the two side surfaces, and each flange, in cross-section parallel to each one of the two side surfaces, being of generally inverted L-shape having a generally vertical section and a generally horizontal section, the horizontal section extending from the vertical section towards the forward portion of the device, wherein, the device is connected by the connection means within the cabinet below the card cage and above the opening beneath the forward portion of the card cage, with the forward portion of the device located near the forward portion of the card cage, and the rear portion of the device located near the rear portion of the card cage.

* * * * *